United States Patent
Haack et al.

(10) Patent No.: US 10,196,739 B2
(45) Date of Patent: Feb. 5, 2019

(54) PLASMA VAPOR DEPOSITED (PVD) COATING PROCESS

(71) Applicant: Ford Global Technologies, LLC, Dearborn, MI (US)

(72) Inventors: Larry P. Haack, Ann Arbor, MI (US); Ann Marie Straccia, Southgate, MI (US); Steven J. Simko, Shelby Township, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 295 days.

(21) Appl. No.: 15/348,405

(22) Filed: Nov. 10, 2016

(65) Prior Publication Data

US 2017/0058399 A1   Mar. 2, 2017

Related U.S. Application Data

(60) Division of application No. 14/029,341, filed on Sep. 17, 2013, now Pat. No. 9,522,569, which is a
(Continued)

(51) Int. Cl.
  *C23C 16/50* (2006.01)
  *C23C 16/06* (2006.01)
  (Continued)

(52) U.S. Cl.
  CPC .............. *C23C 16/06* (2013.01); *B60B 19/00* (2013.01); *C23C 16/50* (2013.01); *C23C 28/00* (2013.01);
  (Continued)

(58) Field of Classification Search
  CPC .................................. C23C 16/40; C23C 16/50
  See application file for complete search history.

(56) References Cited

U.S. PATENT DOCUMENTS

| 4,170,579 A | 10/1979 | Bosso et al. |
| 4,432,850 A | 2/1984 | Moriarity et al. |

(Continued)

FOREIGN PATENT DOCUMENTS

| WO | 2007100363 A1 | 9/2007 | |
| WO | WO-2012061211 A2 * | 5/2012 | ............... B32B 7/12 |

OTHER PUBLICATIONS

Volz, Industrial Color Testing—Fundamentals and Techniques, 2nd Ed. Wiley-VCH, New York, 2001, p. 1-385 (Year: 2001).*

(Continued)

*Primary Examiner* — Dah-Wei D. Yuan
*Assistant Examiner* — Nga Leung V Law
(74) *Attorney, Agent, or Firm* — Julia Voutyras; Brooks Kushman P.C.

(57) ABSTRACT

A plasma vapor deposited (PVD) coating method. The method includes overlaying a primer polymer layer onto a substrate surface. The method further includes overlaying a chrome metallic layer onto the primer polymer. The method also includes depositing a plasma vapor deposited (PVD) oxide layer of a thickness of 1 to 5 nanometers onto the chrome metallic layer and having a parameter of color change of the underlying chrome metallic layer. The color change may be determined according to the following equation:

$$\Delta E^*_{ab} = \sqrt{(\Delta L^*)^2 + (\Delta a^*)^2 + (\Delta b^*)^2}$$

L is the color brightness of the oxide layer, and a and b are the color-component dimensions of the oxide and metallic layers. $\Delta E^*_{ab}$ may be less than 2.3. The method further includes overlaying an exposed polymeric layer onto the PVD oxide layer to form a protective layer at the interface between the exposed polymeric layer and the oxide layer.

20 Claims, 2 Drawing Sheets

Related U.S. Application Data continuation of application No. 13/178,859, filed on Jul. 8, 2011, now abandoned.

(60) Provisional application No. 61/365,477, filed on Jul. 19, 2010.

(51) Int. Cl.
*C23C 28/00* (2006.01)
*B60B 19/00* (2006.01)

(52) U.S. Cl.
CPC ... *B60B 2310/614* (2013.01); *B60B 2310/616* (2013.01); *B60B 2310/654* (2013.01); *B60Y 2200/11* (2013.01); *Y10T 428/12611* (2015.01); *Y10T 428/263* (2015.01); *Y10T 428/265* (2015.01); *Y10T 428/31551* (2015.04); *Y10T 428/31663* (2015.04)

(56) References Cited

U.S. PATENT DOCUMENTS

| | | |
|---|---|---|
| 4,610,769 A | 9/1986 | Bosso et al. |
| 4,689,131 A | 8/1987 | Roue et al. |
| 4,880,543 A | 11/1989 | Khosah et al. |
| 5,096,556 A | 3/1992 | Corrigan et al. |
| 5,302,414 A | 4/1994 | Alkhimov et al. |
| 5,795,626 A | 8/1998 | Gabel et al. |
| 6,200,208 B1 | 3/2001 | Andrews et al. |
| 6,420,032 B1 | 7/2002 | Iacovangelo |
| 6,872,425 B2 | 3/2005 | Kaufold et al. |
| 6,896,970 B2 | 5/2005 | Mayzel |
| 6,921,251 B2 | 7/2005 | Ackerman et al. |
| 7,140,949 B2 | 11/2006 | Gatton et al. |
| 7,279,078 B2 | 10/2007 | Kapourchali et al. |
| 7,291,252 B2 | 11/2007 | Li et al. |
| 2002/0102416 A1* | 8/2002 | Mayzel ............... B05D 5/068 428/447 |
| 2003/0173893 A1 | 9/2003 | Shibasaki et al. |
| 2005/0196616 A1 | 9/2005 | Stewart et al. |
| 2005/0258441 A1 | 11/2005 | Shitagami |
| 2007/0207310 A1* | 9/2007 | Storey ............... B05D 5/068 428/336 |
| 2009/0050883 A1 | 2/2009 | Hayashi et al. |
| 2013/0209814 A1 | 8/2013 | Bharti et al. |

OTHER PUBLICATIONS

Russo, Charles J., Coatings Durability and Mechanical Reliability of PVD—Bright Chrome Coated Aluminum Wheels, SAE Technical Paper Series, 2007-01-1530, Detroit, Michigan, Apr. 16-19, 2007, pp. 1-13.

Völz, Hans G., Industrial Color Testing—Funcamental and Techniques, 2nd Ed. Wiley-VCH, New York, 2001, pp. 1-385.

Hofmann, S, Quantitative Depth Profiling is Surface Analysis: A Review, Surface and Interface Analysis, 2(4), 1980, pp. 148-160.

Tomkins, Harland G., A Users Guide to Ellipsometry, New York, 1993, Academic Press, Inc., cover page and pp. 35-45.

Standard Test Methods for Measuring Adhesion by Tape Test, ASTM D3359, Jun. 1, 2009, pp. 1-8.

* cited by examiner

PLASMA VAPOR DEPOSITED (PVD) COATING PROCESS

CROSS-REFERENCE TO RELATED APPLICATIONS

This application is a divisional of U.S. application Ser. No. 14/029,341 filed Sep. 17, 2013, now issued as U.S. Pat. No. 9,522,569 on Dec. 20, 2016, which is a continuation of U.S. application Ser. No. 13/178,859 filed Jul. 8, 2011, now abandoned, which claims the benefit of U.S. provisional application Ser. No. 61/365,477 filed Jul. 19, 2010, all documents in which are incorporated herein by reference in their entirety.

TECHNICAL FIELD

The present invention relates to a plasma vapor deposited (PVD) coating process.

BACKGROUND

Articles such as coated wheels in the art may experience coating layer failure when exposed to contact with physical objects such as gravel or stones, as well as extreme temperatures and/or rapid temperature changes. It is desirable to provide wheels that are relatively resistant to one or more such layer failures.

SUMMARY

According to a first embodiment, a plasma vapor deposited (PVD) coating method is disclosed. The method includes overlaying a primer polymer layer onto a substrate surface. The method further includes overlaying a chrome metallic layer onto the primer polymer. The method also includes depositing a plasma vapor deposited (PVD) oxide layer of a thickness of 1 to 5 nanometers onto the chrome metallic layer and having a parameter of color change of the underlying chrome metallic layer. The color change may be determined according to the following equation:

$$\Delta E^*_{ab} = \sqrt{(\Delta L^*)^2 + (\Delta a^*)^2 + (\Delta b^*)^2}$$

L is the color brightness of the oxide layer, and a and b are the color-component dimensions of the oxide and metallic layers. $\Delta E^*_{ab}$ may be less than 2.3. The method further includes overlaying an exposed polymeric layer onto the PVD oxide layer to form a protective layer at the interface between the exposed polymeric layer and the oxide layer.

In another embodiment, a plasma vapor deposited (PVD) coating method is disclosed. The method includes overlaying a primer polymer layer onto a substrate surface. The method further includes overlaying a chrome metallic layer onto the primer polymer. The method also includes depositing a plasma vapor deposited (PVD) oxide layer of a thickness of 1 to 5 nanometers onto the chrome metallic layer and having a parameter of color change of the underlying chrome metallic layer. The color change may be determined according to the following equation:

$$\Delta E^*_{ab} = \sqrt{(\Delta L^*)^2 + (\Delta a^*)^2 + (\Delta b^*)^2}$$

L is the color brightness of the oxide layer, and a and b are the color-component dimensions of the oxide and metallic layers. $\Delta E^*_{ab}$ may be less than 2.3. The method further includes overlaying an exposed polymeric layer onto the PVD oxide layer to form a protective layer at the interface between the exposed polymeric layer and the oxide layer.

Yet another embodiment discloses a plasma vapor deposited (PVD) coating method including the step of depositing a plasma vapor deposited (PVD) oxide layer of a thickness of 1 to 5 nanometers onto the chrome metallic layer and having a parameter of color change of the underlying chrome metallic layer. The color change may be determined according to the following equation:

$$\Delta E^*_{ab} = \sqrt{(\Delta L^*)^2 + (\Delta a^*)^2 + (\Delta b^*)^2}$$

L is the color brightness of the oxide layer, and a and b are the color-component dimensions of the oxide and metallic layers. $\Delta E^*_{ab}$ may be less than 2.3. The method further includes overlaying an exposed polymeric layer to form a protective layer.

DETAILED DESCRIPTION

As required, detailed embodiments of the present invention are disclosed herein. However, it is to be understood that the disclosed embodiments are merely exemplary of the invention that may be embodied in various and alternative forms. Therefore, specific structural and functional details disclosed herein are not to be interpreted as limiting, but merely as a representative basis for the claims and/or a representative basis for teaching one skilled in the art to variously employ the present invention.

Moreover, except where otherwise expressly indicated, all numerical quantities in the description and in the claims are to be understood as modified by the word "about" in describing the broader scope of this invention. Unless expressly stated to the contrary, the description of a group or class of material is suitable or preferred for a given purpose in connection with the invention implies that mixtures of any two or more members of the group or class may be equally suitable or preferred.

In durability testing of aluminum wheels having a chrome/aluminum alloy, inter-layer adhesion failure has been reported to occur between the alloy layer and an adjacent polymer or resin layer. This may resemble what may occur during a car wash on a cold day, or alternatively, when a vehicle wheel is contacted with gravel or stones during driving. The present invention, in one or more embodiments, is believed to solve the adhesion failure problems mentioned above.

Figure 1A:
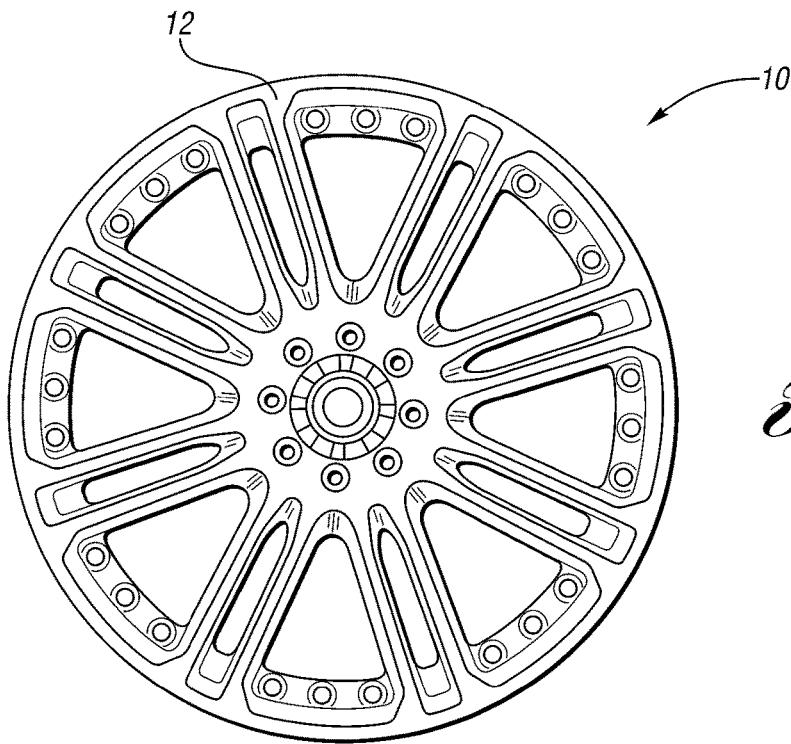
FIGS. 1A and 1B respectively depict a front view and a side view of a vehicle wheel according to one embodiment.
Figure 1B:
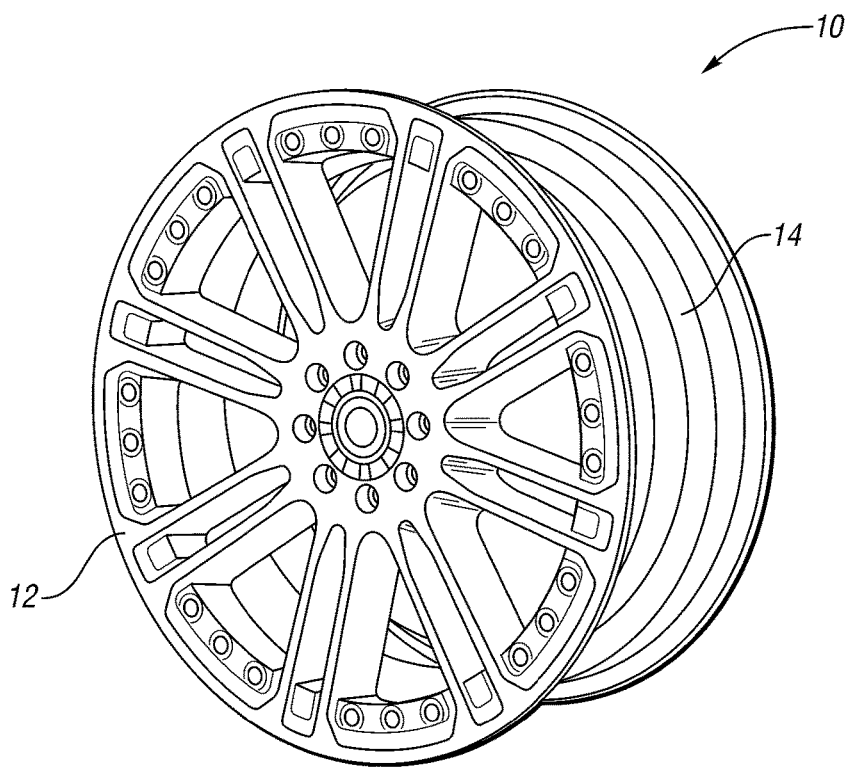

In one embodiment, and as depicted in FIGS. 1A and 1B, an article such as a vehicle wheel generally shown at 10 includes a front portion 12 and rim portion 14. To the outer surfaces of the front portion 12 and/or rim portion 14 is applied a coating system which is detailed herein, with relatively improved inter-layer adhesion and hence greater resistance to damage from contact or temperature challenges. In the case of the article being a vehicle wheel, the vehicle wheel may be formed of any suitable material such as steel, aluminum alloy, cast aluminum, magnesium, and/or magnesium alloy.

Figure 2:
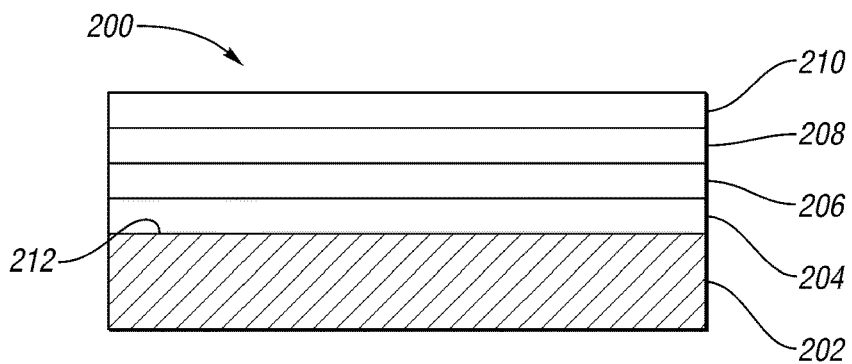
FIG. 2 depicts a cross-sectional view of surface layers of an article such as a vehicle wheel according to another embodiment.

In another embodiment, and as depicted in FIG. 2, an article such as a vehicle wheel generally shown at 200 includes a substrate 202 having a surface 212, to which is applied a metallic layer 206 including a first metal (not shown), and an oxide layer 208 contacting the metallic layer 206 and including an oxide of a second metal (not shown) different from the first metal. In certain instances, the article 200 may further include one or more primer polymer layers generally shown at 204, which are positioned between the metallic layer 206 and the substrate 202, the surface 212 of the substrate 202 in particular. In the event that two or more primer polymer layers 204 are employed, the primer polymer layers 204 may be chemically different from each other. In certain other instances, the article 200 may further include one or more outer polymer layers generally shown at 210. In the event that two or more top polymer layers 210 are employed, the outer polymer layers 210 may be chemically different from each other.

Without wanting to be limited to any particular theory, it is believed that the oxide layer 208 helps provide additional polar groups on the metallic layer 206 and/or the outer polymer layer 210 for improved adhesion there between.

In one or more embodiments, "layer," as referenced in the metallic layer 206, the oxide layer 208, the outer polymer layer 210 and the primer polymer layer 204, may include sub-layers of identical chemical composition, each of which may be individually applied.

The primer polymer layer 204, the metallic layer 206, the oxide layer 208 and/or the outer polymer layer 210 may be applied by any suitable coating processes. A non-limiting example of the coating process is cold gas spraying, as disclosed in U.S. Pat. No. 5,302,414, which is incorporated by reference herein in its entirety. In the process of cold gas spraying, a layer is applied by spraying a high velocity flow of powder, which is in solid state, at a temperature which is lower than the melting point of the powder material. Another non-limiting example of the coating process is, as disclosed in U.S. Pat. No. 5,795,626, which is incorporated by reference herein in its entirety, triboelectric discharge kinetic spraying and thermal spray technologies including high velocity combustion, low velocity combustion, plasma spray and twin wire arc spray. Another non-limiting example of the coating process is electrolytic coating involving one or more cationic polymers. The polymer coating bath may be an aqueous electrolytic bath, containing cationic polymers which may be deposited onto the surface from an electrolytic bath.

In certain instances, the metallic layer 206 and/or the oxide layer may be applied via physical vapor deposition (PVD). A non-limiting example of the PVD method is disclosed in "Coatings Durability and Mechanical Reliability of PVD—Bright Chrome Coated Aluminum Wheels" authorized by Charles J. Russo, SAE 2007-01-1530, which is incorporated by reference herein in its entirety. Without wanting to be limited by any particular theory, it is believed that the PVD method is relatively more environmental friendly than other locating methods, such as electrolytic cladding methods which often use toxic electrolytic solutions.

The primer polymer layer 204 and/or the outer polymer layer 210 may each independently include any suitable polymer compositions, such as those disclosed in the following publications: U.S. Pat. Nos. 4,170,579 and 4,610,769 to Bosso et al., U.S. Pat. No. 5,096,556 to Corrigan et al., U.S. Pat. No. 4,432,850 to Moriarity et al., and U.S. Pat. No. 4,689,131 to Roue, all of which are incorporated by reference herein in their entirety. In certain instances, the top polymer layer 210 includes an acrylate, with or without a pigment.

Figure 3:
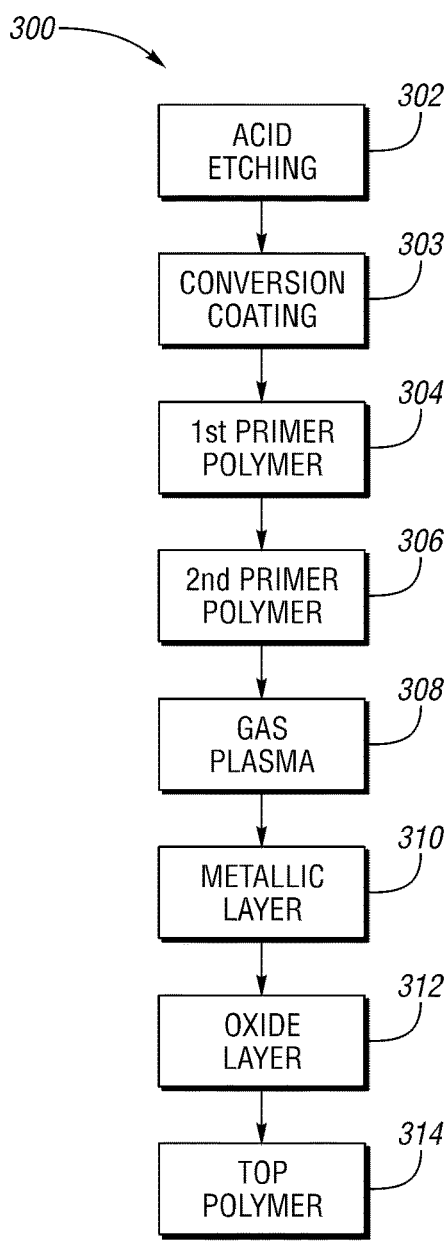
FIG. 3 depicts a process flow of making an article such as a coated wheel according to yet another embodiment.

The article 200 may be coated according to a method generally shown at 300 as depicted in FIG. 3. In one embodiment, the method 300 includes a step 312 of forming an oxide layer on a surface having a metal oxide layer. The method 300 may further include one or more of steps 302, 303, 304, 306, 308, 310 and 314.

At step 302, the surface is etched for cleaning and to remove surface oxides, using, in particular, an acid etching process.

At step 303, the surface is modified with a conversion coating for anti-corrosion treatment.

At step 304, the conversion coated surface is coated with a first primer layer mainly to level the surface. This first primer layer may be applied using any suitable spraying or powder layer process and is subsequently cured. If the substrate is heat stable, such as metal-based substrate, the curing may be done in an oven. If the substrate is heat labile, such as plastics-based substrate, the curing may be carried out using ultraviolet light curing.

After cure, the article such as a vehicle wheel is transferred to a vacuum chamber such as a PVD vacuum chamber. In this chamber, the existing cured coating layer is treated with a gas plasma, followed by deposition of a thin metallic layer. Non-limiting examples of the gas applied in the gas plasma may include argon, oxygen, nitrogen, air, or combinations thereof. In certain instances, argon plasma is used in this step to provide a relatively more subtle plasma treatment. The gas plasma treatment of the primer layer is performed to enhance adhesion to the applied metallic layer. In certain instances, the metallic layer is again subjected to a gas plasma within the PVD vacuum chamber.

At step 306, the surface may be further coated with a second primer layer. The second primer layer may be chemically different from the first primer layer. In this scenario, while the first primer layer is mainly to level the surface, the second primer layer is to prime the surface for subsequent layers, particular for subsequent application of the metallic layer.

At step 308, the surface may be subject to a plasma treatment, such as a plasma using argon gas, to activate the surface for subsequent metallic layer application.

At step 310, the surface is coated with the metallic layer. One or both of the steps 310 and 312 may be carried out under vacuum, and in certain instances, via the application of plasma vapor deposition. With the use of PVD, the oxide composition may be injected into the metallic layer at a relatively high energy such that the thickness of the oxide layer may be controlled to be extremely thin, such as 1 to 5 nanometers. At this thickness, the oxide layer is believed to be transparent enough so as not to reduce the metallic appearance of the underlying metallic layer to any significant degree, while providing benefits in improving adhesion.

At step 314, the surface may be coated with an outer polymer layer (in some instances, a top polymer layer), which functions as a protective layer over the metallic layer from the environment.

The metallic layer 206 may include any suitable metal elements. Suitable metal elements include transition metals, and those from groups 13 and 14 of the periodic table. In certain instances, the metallic layer 206 includes chrome, aluminum, or alloys thereof.

The oxide layer 208 may include one or more oxides selected from the group consisting of oxides of electropositive elements, oxides of electronegative elements, oxides of amphoteric elements, and combinations thereof, as long as at least one of the oxides being an oxide of a metal different from the metal included in the metallic layer 206. In certain instances, the oxide layer 208 includes one or more of a titanium oxide ($TiO_2$), a silicon oxide ($SiO_2$), nickel oxide ($Ni_2O_3$), tin oxide ($SnO_2$), and/or aluminum oxide ($Al_2O_3$).

Non-limiting examples of the oxide of the oxide layer 208 include an oxide of one or more elements of the first row of transition metals such as nickel, iron, cobalt, copper, and zinc, or those from the second row of transition metals such as zirconium or yttrium. Without wanting to be limited to any particular theory, it is believed that these metals are capable of forming oxides in the form of hydroxides $M(OH)_x$. Metal hydroxides $M(OH)_x$ possess exchangeable hydrogen atoms that are able to form strong and durable covalent bonds with coupling agents in the outer polymer layer 210. For instance, –c=n cyano groups in the outer polymer layer 210 may react to form urethane linkages, and siloxane coupling agents will form M-O—Si bonds. Thus the metal oxide binder can be matched with specific coupling agents in the outer polymer layer 210 to meet necessary bonding requirements.

In certain instances, the metallic layer 206 includes a first metallic surface contacting the oxide layer, a second metallic surface, and a metallic bulk spacing apart the first and second metallic surfaces, the first metallic surface includes an increased concentration of polar groups relative to the second metallic surface. The polar groups include hydroxyl groups $OH^-$. In certain particular instances, the concentration of the polar groups, and hydroxyl groups in particular, of the first metallic surface is at least 5 percent, 10 percent, 15 percent or 20 percent greater in atomic weight relative to that of the second metallic surface.

In certain other instances, the polymer layer 210 includes a first polymer surface contacting the oxide layer, a second polymer surface, and a polymer bulk spacing apart the first and second polymer surfaces, the first polymer surface includes an increased concentration of polar groups relative to the second polymer surface. The polar groups include hydroxyl groups $OH^-$. In certain particular instances, the concentration of the polar groups, and hydroxyl groups in particular, of the first polymer surface is at least 5 percent, 10 percent, 15 percent or 20 percent greater in atomic weight relative to that of the second polymer surface.

In certain instances, the thickness of the oxide layer 208 is relatively small to not impart a color change to the underlying metallic layer in any significant degree. In certain instances, the thickness of the oxide layer 208 is less than 10 nm, and particularly 1 to 5 nanometers.

In one or more embodiment, the parameter of the color change can be expressed, according to the International Commission on Illumination (CIE), as $\Delta E^*_{ab}$ in terms of the CIELAB color space by the equation, $$\Delta E^*_{ab} = \sqrt{(\Delta L^*)^2 + (\Delta a^*)^2 + (\Delta b^*)^2}$$

where is L is the color brightness, and a and b are the complimentary color-opponent dimensions. A non-limiting example of the color change determination may be found according to Hans G. Völz, "Industrial Color Testing—Fundamentals and Techniques", second, completely revised edition, translated by Ben Teague, Wiley-VCH, New York (2001), which is incorporated by reference herein in its entirety.

In certain instances, the oxide layer 208 as deposited onto the metallic layer 206 is relatively thin such that $\Delta E^*$, the color difference of the metallic layer 206 before and after deposition of the oxide layer 208, is less than 2.3, a number associated with a "just noticeable difference" of color differences to the human eye. In certain particular instances, $\Delta E^*$ is less than 1.0, which is identified as a color difference indistinguishable to the human eye.

The thickness of the oxide layer 208 may be determined using any suitable methods. A non-limiting example involves the use of ion sputter depth profiling, coupled with a surface sensitive analysis technique such as Auger electron spectroscopy (AES), X-ray photoelectron spectroscopy (XPS), and secondary ion mass spectrometry (SIMS). In this method, a beam of ions, typically rare gas ions such as argon, is directed at the surface of a solid. These ions interact with the surface in a process called a collision cascade. Material is removed from the surface by ion sputtering. Over time this process removes material from the surface, exposing subsurface layers. These are measured by one of the above mentioned surface analysis techniques. By measuring the surface composition as a function of sputter time, the composition and thickness of thin films can be determined. A reference for the method may be found in Hofmann, S., "Quantitative Depth Profiling is Surface Analysis: A Review", *Surface and Interface Analysis*, 2(4) 148 (1980), which is incorporated by reference herein in its entirety.

Another non-limiting example of the method involves ellipsometry. The sample is illuminated with a beam of polarized light and the resulting change in polarization of the reflected beam is measured. The degree of polarization change that occurs is determined by the optical constants of the thin film, including the film thickness. A reference for this method may be found on pages 35 to 45 of Tomkins, H. G., "A users Guide to Ellipsometry, New York, 1993, Academic Press, Inc., relevant content of which is incorporated by reference herein in its entirety.

Although being directed to a wheel, the above described layer structure and/or method of forming are equally applicable to any suitable substrates and surfaces thereof, including plastics, metals, polymers, and combinations thereof.

EXAMPLES

A 200 nm layer of chrome is deposited by plasma vapor deposition (PVD) in an argon atmosphere at a partial pressure of 11 mTorr onto a substrate using a Perkin-Elmer ULTEK model 2400 RF sputtering system. A paint layer of a carbamate coat composition at 50 µm thickness is applied over the chrome layer and baked to cure.

A second chrome layer is deposited in an identical manner onto a companion sample, onto which is subsequently deposited by PVD a silicon oxide (silica) layer at a thickness of 5 nm. The silica layer is thin enough to be essentially transparent and not obscure the coloration of the chrome. A clear carbamate paint layer of 50 µm thickness is then applied over the silica layer and baked to cure.

A third chrome layer is deposited in an identical manner onto a companion sample, onto which is subsequently deposited by PVD a titanium oxide (titania) layer at a thickness of 5 nm. The titania layer is thin enough to be essentially transparent and not to obscure the coloration of the chrome. A clear carbamate paint layer of 50 µm thickness is then applied over the titania layer and baked to cure.

A cross-hatch adhesion test is performed on each sample to test the relative adhesion strength of the carbamate paint layer to the underlying chrome layer, or chrome layer coated with an oxide binder layer. The cross-hatch adhesion test may be carried out according to Standard Test Methods for Measuring Adhesion by Tape Test, ASTM D3359.

These tests reveal a 98% delamination of the carbamate paint layer from the chrome layer, a 49% delamination of the carbamate paint layer from the chrome layer coated with the silica binder layer, and a 6% delamination of the carbamate paint layer from the chrome layer coated with the titania binder layer. The experiments reveal that adhesion to chrome can be greatly improved, or delamination failure can be greatly reduced, by the addition of an oxide binder layer.

For this experiment a carbamate paint system is utilized as it is able to readily differentiate adhesion strength between the layers tested. In practice, other paint systems such as acrylic paints or epoxy paints might likely yield stronger adhesion to the chrome layer, but would still be susceptible to adhesion failure in durability when subjected to testing at elevated humidity or when subjected to rapid changes in temperature without the exceptional durability imparted by an oxide layer.

While the best mode for carrying out the invention has been described in detail, those familiar with the art to which this invention relates will recognize various alternative designs and embodiments for practicing the invention as defined by the following claims.

What is claimed is:

1. A method comprising:
overlaying a primer polymer layer onto a substrate surface;
overlaying a chrome metallic layer onto the primer polymer;
depositing a plasma vapor deposited (PVD) oxide layer of a thickness of 1 to 5 nanometers onto the chrome metallic layer and having a parameter of color change of the underlying chrome metallic layer determined according to the following equation:

$$\Delta E^*_{ab} = \sqrt{(\Delta L^*)^2 + (\Delta a^*)^2 + (\Delta b^*)^2}$$

wherein L is a color brightness of the oxide layer, and a and b are color-opponent dimensions of the PVD oxide and chrome metallic layers, wherein $\Delta E^*_{ab}$ is less than 2.3; and
overlaying an exposed polymeric layer onto the PVD oxide layer to form a protective layer at the interface between the exposed polymeric layer and the oxide layer.

2. The method of claim 1, wherein the protective layer directly contacts the exposed polymeric layer and the oxide layer.

3. The method of claim 1, wherein the protective layer includes urethane linkages formed between the exposed polymeric layer and the oxide layer.

4. The method of claim 1, wherein the protective layer includes M-O—Si bonds formed between the exposed polymeric layer and the oxide layer.

5. The method of claim 4, wherein the exposed polymeric layer includes a siloxane coupling agent.

6. The method of claim 1, wherein the PVD oxide layer includes titanium oxide.

7. The method of claim 1, wherein the exposed polymeric layer includes a carbamate clearcoat.

8. A method comprising:
overlaying a primer polymer layer onto a substrate surface;
overlaying a chrome metallic layer onto the primer polymer;
depositing a plasma vapor deposited (PVD) oxide layer of a thickness of 1 to 5 nanometers onto the chrome metallic layer and having a parameter of color change of the underlying chrome metallic layer determined according to the following equation:

$$\Delta E^*_{ab} = \sqrt{(\Delta L^*)^2 + (\Delta a^*)^2 + (\Delta b^*)^2}$$

wherein L is a color brightness of the oxide layer, and a and b are color-opponent dimensions of the PVD oxide and chrome metallic layers, wherein $\Delta E^*_{ab}$ is less than 2.3; and
overlaying an exposed polymeric layer onto the PVD oxide layer to react the exposed polymeric layer and the oxide layer to form a protective layer at the interface.

9. The method of claim 8, wherein the protective layer directly contacts the exposed polymeric layer and the oxide layer.

10. The method of claim 8, wherein the protective layer includes urethane linkages formed between the exposed polymeric layer and the oxide layer.

11. The method of claim 8, wherein the protective layer includes M-O—Si bonds formed between the exposed polymeric layer and the oxide layer.

12. The method of claim 11, wherein the exposed polymeric layer includes a siloxane coupling agent.

13. The method of claim 8, wherein the PVD oxide layer includes titanium oxide.

14. The method of claim 8, wherein the exposed polymeric layer includes a carbamate clearcoat.

15. A method comprising:
plasma vapor depositing an oxide layer of a thickness of 1 to 5 nanometers onto a chrome metallic layer and having a color change parameter of the underlying metallic layer as follows:

$$\Delta E^*_{ab} = \sqrt{(\Delta L^*)^2 + (\Delta a^*)^2 + (\Delta b^*)^2}$$

L is the oxide layer color brightness, a and b are color-opponent dimensions of the oxide and metallic layers, and $\Delta E^*_{ab}$ is less than 2.3; and
overlaying an exposed polymeric layer on the oxide layer to form a protective layer.

16. The method of claim 15, further comprising overlying an exposed polymeric layer onto the oxide layer to react the exposed polymeric layer and the oxide layer to form a protective layer at the interface.

17. The method of claim 16, wherein the protective layer directly contacts the exposed polymeric layer and the oxide layer.

18. The method of claim 16, wherein the protective layer includes urethane linkages formed between the exposed polymeric layer and the oxide layer.

19. The method of claim 16, wherein the protective layer includes M-O—Si bonds formed between the exposed polymeric layer and the oxide layer.

20. The method of claim 19, wherein the exposed polymeric layer includes a siloxane coupling agent.

* * * * *